United States Patent
Kim

(10) Patent No.: US 7,990,203 B2
(45) Date of Patent: Aug. 2, 2011

(54) INTERNAL VOLTAGE GENERATION APPARATUS FOR SEMICONDUCTOR DEVICE

(75) Inventor: Saeng Hwan Kim, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 66 days.

(21) Appl. No.: 11/647,733

(22) Filed: Dec. 29, 2006

(65) Prior Publication Data

US 2007/0159232 A1    Jul. 12, 2007

(30) Foreign Application Priority Data

Jan. 9, 2006   (KR) .................. 10-2006-0002322

(51) Int. Cl.
    *G11C 5/14*     (2006.01)
(52) U.S. Cl. ........................ 327/530; 327/538
(58) Field of Classification Search .................. 327/530, 327/538–544, 142, 143, 198

See application file for complete search history.

(56) References Cited

U.S. PATENT DOCUMENTS

| | | | |
|---|---|---|---|
| 5,606,295 A * | 2/1997 | Ohara et al. | 331/116 FE |
| 5,844,853 A | 12/1998 | Kitsukawa et al. | |
| 7,285,051 B2 * | 10/2007 | Eguchi et al. | 463/43 |
| 7,518,424 B2 * | 4/2009 | Yeh | 327/170 |
| 2002/0075062 A1 * | 6/2002 | Kitade | 327/530 |
| 2003/0214345 A1 * | 11/2003 | Yamauchi et al. | 327/530 |

FOREIGN PATENT DOCUMENTS

KR   20-1999-0041168   12/1999

* cited by examiner

*Primary Examiner* — Lincoln Donovan
*Assistant Examiner* — Diana J Cheng
(74) *Attorney, Agent, or Firm* — John P. White; Cooper & Dunham LLP

(57) ABSTRACT

An internal voltage generation apparatus for a semiconductor device is disclosed. The internal voltage generation apparatus includes a power-up detector for receiving an external supply voltage and generating a power-up signal, an internal voltage generator for generating a plurality of internal voltages, and an initial level holder including a plurality of transistors for supplying the external supply voltage to the internal voltage generator in response to the power-up signal, and a plurality of passive elements connected in parallel with the transistors, respectively.

17 Claims, 3 Drawing Sheets

INTERNAL VOLTAGE GENERATION APPARATUS FOR SEMICONDUCTOR DEVICE

FIELD OF THE DISCLOSURE

The present disclosure relates to an internal voltage generation apparatus for a semiconductor device, and more particularly to an internal voltage generation apparatus for a semiconductor device which is powered up by transistors turned on in response to a power-up signal and wherein passive elements are provided to, even when the voltage level of the power-up signal is below a threshold voltage level, supply an external supply voltage, a ground voltage and the power-up signal to an internal voltage generator to initialize internal voltages of the internal voltage generator, so that initial internal voltages can be stably generated by the internal voltage generator.

DESCRIPTION OF THE RELATED ART

Generally, in a semiconductor device, for example, a semiconductor memory device, internal voltages are generated based on an external supply voltage VDD to drive respective components of the memory device. When the external supply voltage VDD is initially applied to the memory device, the internal voltages are generated in various forms. Here, the internal voltages refer to a VCP that is a voltage to the plate electrode of a capacitor constituting the memory device, a VBLP that is a bit line precharge voltage, a VBB that is a body voltage of a memory cell transistor, and so forth.

An internal voltage generation apparatus is designed to generate the internal voltages only when the external supply voltage exceeds a predetermined voltage level after being initially applied. A power-up signal of FIG. 1 is generated to drive the internal voltage generation apparatus upon detecting that the external supply voltage exceeds the predetermined voltage level. The internal voltages are generated only when the power-up signal is transferred to the internal voltage generation apparatus. To this end, the internal voltage generation apparatus includes an initial level holder which is installed between the external supply voltage (or a ground voltage) and an internal voltage generator and driven in response to the power-up signal. This initial level holder is generally composed of MOS transistors.

However, because the initial level holder is composed of the MOS transistors, problems occur as follows. The MOS transistor generally has a characteristic of being turned on in response to a voltage above a threshold voltage level. In this connection, when the external supply voltage is initially applied, the voltage level of the power-up signal transferred to the initial level holder is below the threshold voltage level, so that the initial level holder is not operated (see a sub-threshold period of FIG. 1). For this reason, there is a problem in that, in the sub-threshold period, the internal voltages VPP, VINT, VBL, VCP and VBB of the internal voltage generation apparatus are initialized not to appropriate levels based on the level of the external supply voltage VDD or ground voltage GND, but to reversed levels thereof. In other words, in an active period where the internal voltages are regularly generated, the generated internal voltages must have levels of VPP>VINT>VBL=VCP>VBB.

Further, the internal voltages VPP, VINT, VBL, VCP and VBB, initialized to the reversed levels in the sub-threshold period, are subject to a greater level reversal due to level amplification in a power-up period. The greater level reversal results in a latch-up phenomenon (a phenomenon in which large current flows in an internal circuit because input and output voltages exceed rated voltages) when the internal voltages are regularly generated and supplied to the memory device in the active period, which leads to a failure of the memory device.

SUMMARY

An internal voltage generation apparatus is provided in this disclosure which, according to an embodiment of this disclosure, is powered up by transistors turned on in response to a power-up signal and wherein passive elements are provided to supply, even when the voltage level of the power-up signal is below a threshold voltage level, an external supply voltage, a ground voltage and the power-up signal to an internal voltage generator to initialize internal voltages of the internal voltage generator, so that initial internal voltages can be stably generated by the internal voltage generator.

In accordance with another aspect of the present disclosure an internal voltage generation apparatus for a semiconductor device can comprise: a power-up detector for receiving an external supply voltage and generating a power-up signal, an internal voltage generator for generating a plurality of internal voltages, and an initial level holder including a plurality of transistors for supplying the external supply voltage to the internal voltage generator in response to the power-up signal, and a plurality of passive elements connected in parallel with the transistors, respectively.

Preferably, each of the transistors has one side connected to the external supply voltage or a ground voltage and the other side connected to the internal voltage generator.

Preferably, each of the passive elements has one side connected to the internal voltage generator and the other side connected to the external supply voltage or a ground voltage.

Each of the passive elements may comprise any one of a resistor, an inductor and a capacitor.

Preferably, the internal voltage generator comprises a VPP regulator for generating a high voltage to a word line, a VINT regulator for generating a local voltage of a cell, a VBL regulator for generating a bit line equalization voltage, a VCP regulator for generating a cell plate voltage, and a VBB regulator for generating a bulk voltage of the cell.

Preferably, the initial level holder comprises first initial level holding means for providing a first initial internal voltage level to the VPP regulator, second initial level holding means for providing a second initial internal voltage level to the VINT regulator, third initial level holding means for providing a third initial internal voltage level to the VBL regulator or the VCP regulator, and fourth initial level holding means for providing a fourth initial internal voltage level to the VBB regulator.

Preferably, each of the first to fourth initial level holding means comprises a corresponding one of the transistors and a corresponding one of the passive elements connected in parallel with the corresponding transistor, and the transistors of the first and second initial level holding means are PMOS transistors, and the transistors of the third and fourth initial level holding means are NMOS transistors.

A resistor may be connected between selected two of the VPP regulator, the VINT regulator, the VBL regulator, the VCP regulator and the VBB regulator.

In accordance with another aspect of the present disclosure an internal voltage generation apparatus for a semiconductor device can comprise a power-up detector for receiving an external supply voltage and generating a power-up signal, an internal voltage generator for generating a plurality of internal voltages, a first initial level holder including a plurality of transistors for providing a plurality of initial internal voltage levels to the internal voltage generator in response to the power-up signal, and a second initial level holder including a passive element connected between an output terminal of the power-up detector and the external supply voltage or a ground voltage for supplying the power-up signal to the internal voltage generator.

BRIEF DESCRIPTION OF THE DRAWINGS

The above and other objects, features and other advantages of the present disclosure will be more clearly understood from the following detailed description taken in conjunction with the accompanying drawings, in which.

DESCRIPTION OF THE PREFERRED EMBODIMENTS

Figure 1:
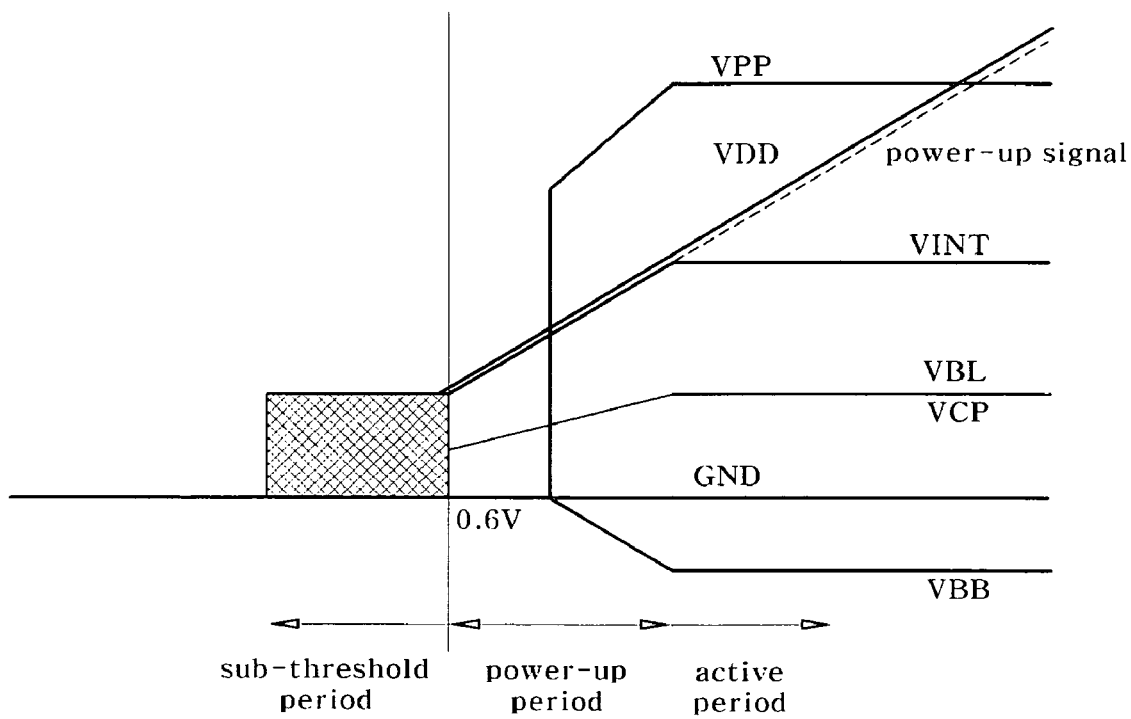
FIG. 1 is a graph showing internal voltage levels of a conventional semiconductor device.

Reference will now be made in detail to the preferred embodiments of the present disclosure, examples of which are illustrated in the accompanying drawings, wherein like reference numerals refer to like elements throughout. The embodiments are described below to explain the subject matter of the present disclosure by referring to the figures.

Figure 2:
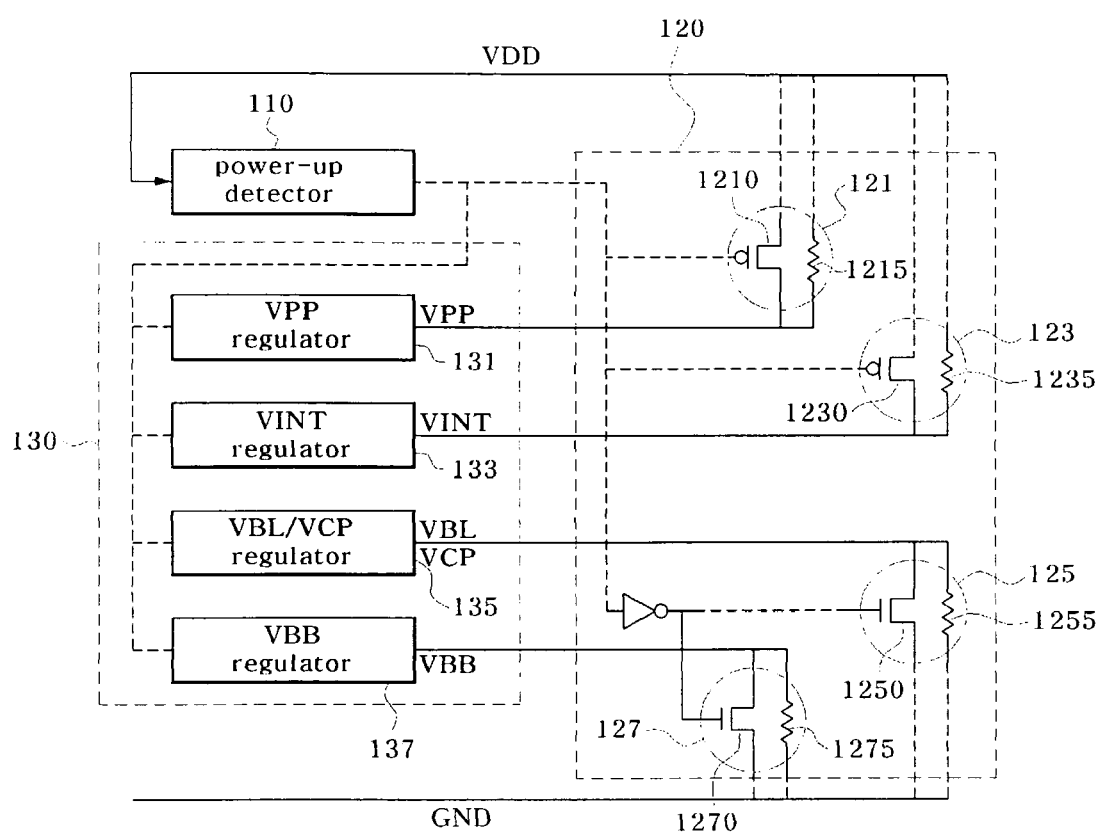
FIG. 2 is a circuit diagram showing a configuration of an internal voltage generation apparatus for a semiconductor device according to a preferred embodiment of the present disclosure.

FIG. 2 is a circuit diagram showing a configuration of an internal voltage generation apparatus for a semiconductor device according to a preferred embodiment of the present disclosure.

Referring to FIG. 2, the internal voltage generation apparatus according to the present embodiment comprises a power-up detector 110, an initial level holder 120, and an internal voltage generator 130.

The power-up detector 110 acts to receive an external supply voltage VDD and generate a power-up signal. The initial level holder 120 acts to set initial internal voltage levels of the internal voltage generator 130 in response to the power-up signal. The internal voltage generator 130 includes a VPP regulator 131, a VINT regulator 133, a VBL/VCP regulator 135, and a VBB regulator 137. Each of these regulators 131, 133, 135 and 137 is adapted to receive the power-up signal and generate a corresponding internal voltage.

The initial level holder 120 includes a plurality of sub-level holders 121, 123, 125 and 127 corresponding respectively to the regulators 131, 133, 135 and 137. The first sub-level holder 121, which provides an initial internal voltage level to the VPP regulator 131, and the second sub-level holder 123, which provides an initial internal voltage level to the VINT regulator 133, are the same in configuration. For example, the first sub-level holder 121 is made up of a PMOS transistor 1210 and a resistor 1215 connected in parallel, and the second sub-level holder 123 is made up of a PMOS transistor 1230 and a resistor 1235 connected in parallel.

A description will hereinafter be provided of the first sub-level holder 121 as an example. The PMOS transistor 1210 is made active by the power-up signal, and has a source connected to the external supply voltage VDD and a drain connected to the VPP regulator 131 (in the second sub-level holder 123, the VINT regulator 133). Alternatively, the resistor 1215 can be replaced with an inductor or capacitor. The resistor 1215 in the first sub-level holder 121 is connected between the external supply voltage VDD and the VPP regulator 131. The resistor 1235 in the second sub-level holder 123 is connected between the external supply voltage VDD and the VINT regulator 133. The third and fourth sub-level holders 125 and 127, which correspond respectively to the VBL/VCP regulator 135 and VBB regulator 137, are the same in configuration. For example, the third sub-level holder 125 is made up of an NMOS transistor 1250 and a resistor 1255 connected in parallel, and the fourth sub-level holder 127 is made up of an NMOS transistor 1270 and a resistor 1275 connected in parallel.

A description will hereinafter be provided of the third sub-level holder 125 as an example. The NMOS transistor 1250 is enabled by the power-up signal inverted by an inverter, and has a source connected to a ground voltage GND and a drain connected to the VBL/VCP regulator 135 (in the fourth sub-level holder 127, the VBB regulator 137). Alternatively, the resistor 1255 and 1275 can be replaced with an inductor or capacitor. The resistor 1255 in the third sub-level holder 127 is connected between the ground voltage GND and the VBL/VCP regulator 135. The resistor 1275 in the fourth sub-level holder 127 is connected between the ground voltage GND and the VBB regulator 137.

A description will hereinafter be provided of the operation of the internal voltage generation apparatus with the above-stated configuration according to the first embodiment of the present disclosure.

First, in a sub-threshold period, the voltage level of the power-up signal supplied to the sub-level holders 121, 123, 125 and 127 is below a threshold voltage level, thereby causing the PMOS transistors 1210 and 1230 and NMOS transistors 1250 and 1270 of the initial level holder 120 to be turned off. At this time, the external supply voltage VDD is provided to the VPP regulator 131 and VINT regulator 133, respectively, through the resistors 1215 and 1235, and the ground voltage GND is provided to the VBL/VCP regulator 135 and VBB regulator 137, respectively, through the resistors 1255 and 1275. In this manner, although the voltage level of the supplied power-up signal is below the threshold voltage level, the external supply voltage VDD or ground voltage GND is supplied to the VPP regulator 131, VINT regulator 133, VBL/VCP regulator 135 and VBB regulator 137 of the internal voltage generator 130 through the resistors 1215, 1235, 1255 and 1275 with no threshold voltage. Therefore, the respective regulators 131, 133, 135 and 137 initialize the corresponding internal voltages to appropriate levels (VPP>VINT>VBL=VCP>VBB) based on the level of the external supply voltage VDD or ground voltage GND.

Thereafter, in a power-up period, the voltage level of the supplied power-up signal is above the threshold voltage level. At this time, the supplied power-up signal also assumes a low level, thereby causing the PMOS transistors 1210 and 1230 and NMOS transistors 1250 and 1270 to be turned on. As a result, the external supply voltage VDD or ground voltage GND is supplied to the respective regulators 131, 133, 135 and 137 through the turned-on PMOS transistors 1210 and 1230 and NMOS transistors 1250 and 1270 instead of the resistors 1215, 1235, 1255 and 1275 with the larger resistance. Consequently, the internal voltages rise with the level of the external supply voltage VDD or ground voltage GND.

Thereafter, in an active period where the power-up signal makes a low-to-high level transition, the PMOS transistors 1210 and 1230 and NMOS transistors 1250 and 1270 are turned off, thus stopping the increase in the internal voltage levels. As a result, the respective regulators 131, 133, 135 and 137 of the internal voltage generator 130, which receive the power-up signal, generate the corresponding internal voltages.

In this manner, even in the sub-threshold period, the initialization of the internal voltages based on the level of the external supply voltage VDD or ground voltage GND is performed through the passive elements with no threshold voltage, such as resistors. Therefore, it is possible to overcome a latch-up phenomenon resulting from internal voltage level reversal and the resulting memory device failure.

Figure 3:
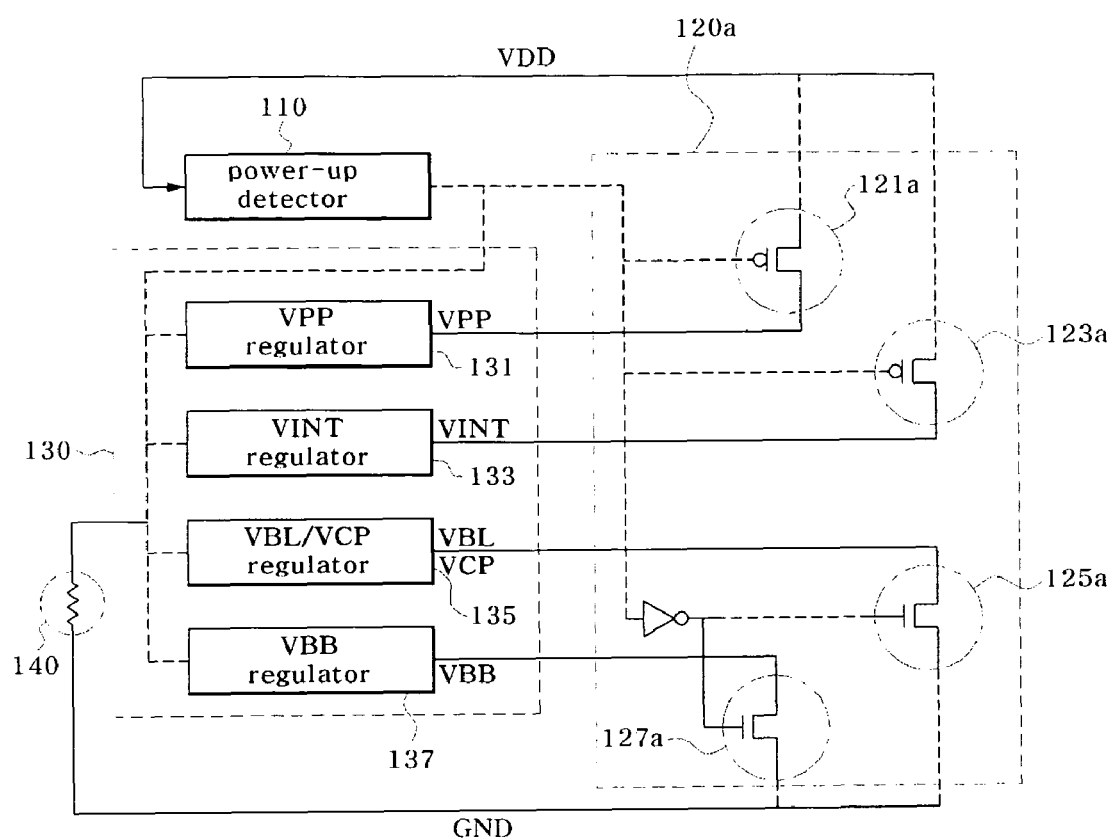
FIG. 3 is a circuit diagram showing a configuration of an internal voltage generation apparatus for a semiconductor device according to an alternative embodiment of the present disclosure.

As an alternative, a passive element 140 may be installed between an output terminal of the power-up detector 110 and the ground voltage GND to remove instability of the internal voltages generated in the sub-threshold period, as shown in FIG. 3. That is, as shown in FIG. 3, an initial level holder 120a includes a plurality of sub-level holders 121a, 123a, 125a and 127a, each of which is implemented with a single MOS transistor, and the passive element 140, such as a resistor, is installed between the output terminal of the power-up detector 110 and the ground voltage GND. As a result, in the sub-threshold period where the MOS transistors of the sub-level holders 121a, 123a, 125a and 127a are not turned on, the power-up signal is supplied to the internal voltage generator 130 through the resistor 140 to initialize the internal voltages of the internal voltage generator 130, thereby overcoming a latch-up phenomenon resulting from internal voltage level reversal and the resulting memory device failure.

As another alternative, a resistor may be provided between selected two of the VPP regulator, VBL regulator, VCP regulator, VINT regulator and VBB regulator. In this case, a potential difference is formed between the two regulators through the resistor to prevent level reversal between the internal voltages generated in the respective regulators. For example, the resistor may be provided between the VBL regulator and the VINT regulator to avoid a latch-up phenomenon resulting from level reversal between the internal voltages VBL and VINT and a memory device failure caused due to the latch-up phenomenon.

As apparent from the above description, the present disclosure provides an internal voltage generation apparatus which is powered up by transistors turned on in response to a power-up signal. Passive elements are provided to, even when the voltage level of the power-up signal is below a threshold voltage level, supply an external supply voltage, a ground voltage and the power-up signal to an internal voltage generator to initialize internal voltages of the internal voltage generator. Therefore, initial internal voltages can be stably generated by the internal voltage generator.

Furthermore, it is possible to prevent a latch-up phenomenon resulting from level reversal of the initial internal voltages generated in the internal voltage generator and a memory device failure caused due to the latch-up phenomenon.

Although the preferred embodiments of the present disclosure have been disclosed for illustrative purposes, those skilled in the art will appreciate that various modifications, additions and substitutions are possible, without departing from the scope and spirit of the disclosure as disclosed in the accompanying claims.

What is claimed is:

1. An internal voltage generation apparatus for a semiconductor device, comprising:
    a power-up detector configured to generate a power-up signal in response to a level of an external supply voltage, the power-up signal having a voltage level that is below a threshold voltage level in a first period, the power-up signal having a first logic level that is above the threshold voltage level in a second period after the first period, and the power-up signal having a second logic level in a third period after the second period;
    an internal voltage generator configured to receive the power-up signal, and generate a plurality of internal voltages; and
    an initial level holder comprising a plurality of transistors connected between the external supply voltage and an output terminal of the internal voltage generator, and a plurality of passive elements connected between the external supply voltage and the output terminal of the internal voltage generator, wherein each one of said transistors is connected in parallel, the transistors are turned on to stabilize the output terminal of the internal voltage generator in response to the power-up signal in the second period, and the transistors are turned off in the first and third period,
    wherein the internal voltage generator comprises:
    a VPP regulator for generating a high voltage to a word line;
    a VINT regulator for generating a local voltage of a cell;
    a VBL regulator for generating a bit line equalization voltage;
    a VCP regulator for generating a cell plate voltage; and
    a VBB regulator for generating a bulk voltage of the cell.

2. The internal voltage generation apparatus according to claim 1, wherein each of the passive elements comprises any one of a resistor, an inductor and a capacitor.

3. The internal voltage generation apparatus according to claim 1, wherein the initial level holder comprises:
    first initial level holding means for providing a first initial internal voltage level to the VPP regulator;
    second initial level holding means for providing a second initial internal voltage level to the VINT regulator;
    third initial level holding means for providing a third initial internal voltage level to one of the VBL regulator and VCP regulator; and
    fourth initial level holding means for providing a fourth initial internal voltage level to the VBB regulator.

4. The internal voltage generation apparatus according to claim 3, wherein each of the first to fourth initial level holding means comprises a corresponding one of the transistors and a corresponding one of the passive elements connected in parallel with the corresponding transistor, and wherein the transistors of the first and second initial level holding means are PMOS transistors, and wherein the transistors of the first to fourth initial level holding means are PMOS transistors.

5. The internal voltage generation apparatus according to claim 1, wherein one of the plurality of passive elements is connected to one of the VPP regulator, the VINT regulator, the VBL regulator, the VCP regulator and the VBB regulator.

6. The internal voltage generation apparatus according to claim 1, wherein the internal voltage generator generates the plurality of internal voltages in the third period.

7. An internal voltage generation apparatus for a semiconductor device comprising:
    a power-up detector configured to generate a power-up signal in response to a level of an external supply voltage;
    an internal voltage generator configured to generate a plurality of internal voltages;
    a first initial level holder comprising a plurality of transistors connected between the external supply voltage and an output terminal of the internal voltage generator to supply the external supply voltage in response to the power-up signal; and a second initial level holder including a passive element connected to all of an output terminal of the power-up detector, the output terminal of the internal voltage generator and a ground voltage.

8. The internal voltage generation apparatus according to claim 7, wherein the power-up signal has a first level in a first period, a second level in a second period and a third level in a third period.

9. The internal voltage generation apparatus according to claim 8, wherein the plurality of transistors are turned on in the second period and the internal voltage generator generates the plurality of internal voltages in the third period.

10. The internal voltage generation apparatus according to claim 7, wherein the internal voltage generator comprises:
   a VPP regulator for generating a high voltage to a word line;
   a VINT regulator for generating a local voltage of a cell;
   a VBL regulator for generating a bit line equalization voltage;
   a VCP regulator for generating a cell plate voltage; and
   a VBB regulator for generating a bulk voltage of the cell.

11. The internal voltage generation apparatus according to claim 10, wherein the passive element is connected to one of the VPP regulator, the VINT regulator, the VBL regulator, the VCP regulator and the VBB regulator.

12. An internal voltage generation apparatus for a semiconductor device comprising:
   a power-up detector configured to generate a power-up signal in response to a level of an external supply voltage;
   an internal voltage generator configured to generate a plurality of internal voltages;
   a first initial level holder comprising a plurality of transistors connected between a ground voltage and an output terminal of the internal voltage generator to supply the ground voltage in response to the power-up signal; and
   a second initial level holder including a passive element connected to all of an output terminal of the power-up detector, the output terminal of the internal voltage generator and the ground voltage.

13. The internal voltage generation apparatus according to claim 12, wherein the power-up signal has a first level in a first period, a second level in a second period and a third level in a third period.

14. An internal voltage generation apparatus for a semiconductor device comprising:
   a power-up detector configured to generate a power-up signal in response to a level of an external supply voltage, the power-up signal having a voltage level that is below a threshold voltage level in a first period, the power-up signal having a first logic level that is above the threshold voltage level in a second period after the first period, and the power-up signal having a second logic level in a third period after the second period;
   an internal voltage generator configured to receive the power-up signal, and generate an internal voltage;
   an initial level holder comprising a plurality of transistors connected between a ground voltage and an output terminal of the internal voltage generator, and a plurality of passive elements connected between the ground supply voltage and the output terminal of the internal voltage generator, wherein each one of said transistors is connected in parallel, the transistors are turned on to stabilize the output terminal of the internal voltage generator in response to the power-up signal in the second period, and the transistors are turned off in the first and third period,
   wherein the internal voltage generator comprises:
   a VPP regulator for generating a high voltage to a word line;
   a VINT regulator for generating a local voltage of a cell;
   a VBL regulator for generating a bit line equalization voltage;
   a VCP regulator for generating a cell plate voltage; and
   a VBB regulator for generating a bulk voltage of the cell.

15. The internal voltage generation apparatus according to claim 14, wherein the internal voltage generator generates the plurality of internal voltages in the third period.

16. The internal voltage generation apparatus according to claim 14, wherein each of the passive elements comprises any one of a resistor, an inductor and a capacitor.

17. The internal voltage generation apparatus according to claim 14, wherein one of the plurality of passive elements is connected to one of the VPP regulator, the VINT regulator, the VBL regulator, the VCP regulator and the VBB regulator.

* * * * *